United States Patent [19]

Orikasa et al.

[11] Patent Number: 4,874,282
[45] Date of Patent: Oct. 17, 1989

[54] PALLET STOCKER APPARATUS FOR PRINTER

[75] Inventors: Teruo Orikasa, Tokyo; Sigeo Sumi, Saitama; Hiroshi Taguchi, Tokyo, all of Japan

[73] Assignee: Somar Corporation, Tokyo, Japan

[21] Appl. No.: 113,968

[22] Filed: Oct. 29, 1987

[30] Foreign Application Priority Data

Jan. 17, 1986 [JP] Japan .................................. 61-7593

[51] Int. Cl.4 ............................................. B65B 69/00
[52] U.S. Cl. .................................... 414/416; 414/796; 414/788.4; 414/788.8
[58] Field of Search ...................... 414/29, 32, 37, 93, 414/331, 787, 416, 796; 271/293, 294; 312/299, 306; 211/126; 53/541

[56] References Cited

U.S. PATENT DOCUMENTS

| | | | |
|---|---|---|---|
| 1,920,825 | 8/1933 | Williams | 312/306 X |
| 4,236,858 | 12/1980 | Hoese et al. | 414/787 X |
| 4,253,656 | 3/1981 | Landa | 271/294 X |
| 4,361,393 | 11/1982 | Noto | 271/294 X |
| 4,466,609 | 8/1984 | Lawrence | 271/293 |
| 4,588,341 | 5/1986 | Motoda | 414/32 |
| 4,638,992 | 1/1987 | Johdai | 271/294 X |

FOREIGN PATENT DOCUMENTS 487669 12/1953 Italy .................................. 312/306

Primary Examiner—Robert J. Spar
Assistant Examiner—William M. Hienz
Attorney, Agent, or Firm—Sughrue, Mion, Zinn, Macpeak & Seas

[57] ABSTRACT

A pallet stocker for a printer in which the pallets, containing film for printing are stacked in a column in pallet supports. To access a given pallet, the higher pallet supports are raised out of the way and the remaining pallets are raised so that a suction arm can remove the top exposed pallet from a fixed level.

8 Claims, 6 Drawing Sheets

PALLET STOCKER APPARATUS FOR PRINTER

BACKGROUND OF THE INVENTION

1. Field of the Invention

The present invention relates to a pallet stocker apparatus and more particularly to an art effectively applicable to the art of pattern printing including printing photoengraving patterns, printed circuit board patterns and plate patterns.

2. BACKGROUND OF THE INVENTION

In a conventional pallet stocker apparatus for a printer, a combination of printing pattern films such as mask, character and sandwich plates prepared according to the layouts of images of finished prints is inverted and exposed against an unexposed film to compose a positive.

In order to increase the efficiency of printing operation, the aforesaid printing pattern films sorted according to the kinds of films are mounted on a pallet and a number of pallets with printing pattern film positioning means are contained in a vertically installed pallet stocker apparatus. Then a desired pallet in the pallet stocker apparatus is moved by mechanical means up to desired height. A printed pattern film carrier, which is reciprocally movable and equipped with a plurality of suction cups, is used to take out each printing pattern film from a pallet and to return the film to a predetermined pallet.

The pallet stocker apparatus for use in a multiplex printer is equipped with a frame formed by removing the front and rear walls from a case. Pairs of guide rails for mounting pallets are installed inside the left and right walls of the frame. A number of pallets (generally made of aluminum about 90 cm (W)×100 cm (D)×3 cm (T)) are furnished with printing pattern film positioning means. A group of small wheels arranged on the guide rails support the pallets so that the fairly heavy pallets may travel smoothly and longitudinally along the guide rails. Pallet stoppers prevent the pallets from falling off it they excessively protrude from the case in the longitudinal direction. Means for elevating the frame act to position the pallet loaded with the desired printing pattern films corresponding to the step of printing operation slightly lower than the top height of the printer. Vertically pallet driving means push forward the pallet positioned to the desired height so that the desired printing pattern film may be taken in and out. There are finally provided means for elevating the frame and longitudinally pallet driving means.

However, the conventional pallet stocker apparatus has posed the following problems.

First, since the pallet is drawn toward this side of the frame formed by removing the front and rear walls from the case to take the printing pattern films in and out, the pallet stocker apparatus requires a space in depth equivalent to the length of the pallet in addition to the depth of the case when it is installed.

Secondly, if used for hours, the group of small wheels for the guide rails used to mount the pallets and that of wheel shafts tend to be subjected to frictional damage and besides they are hardly repairable.

SUMMARY OF THE INVENTION

The present invention is intended to solve the aforesaid problems and it is therefore an object of the invention to provide a reduction of the space for containing and operating pallets in a printing pallet stocker apparatus which contains a plurality of pallets for mounting printing media so that they can be taken in and out.

It is another object of the present invention to provide the improvement of the operability of a printing pallet stocker apparatus for containing a plurality of pallets for mounting printing media so that they can be taken in and out.

Other objects and aspects of the invention will become apparent from the following description of embodiments with reference to the accompanying drawings.

The disclosure of the present invention will briefly be summarized as follows:

The pallet stocker apparatus for a printer according to the present invention comprises a pallet support mechanism for supporting a plurality of pallets piled up with a shape like shelves. The pallet is used to store printing pattern films in such a manner that the films can be taken in and out. The pallet stocker further includes a pallet carrier mechanism for vertically moving each of the pallets.

The pallet stocker apparatus for a printer according to the present invention includes pallet carrier control means for making the pallet carrier mechanism operate so that the plurality of pallets or a given number of pallets as a subgroup are vertically moved up to a predetermined position where the movement of the pallets is stopped once and where at least one pallet is moved up to a predetermined position.

The space for containing and operating the pallets can be reduced and the operability of the printing pallet stocker apparatus can also be improved by supporting the plurality of pallets with a shape like shelves, fitting a printing medium to each pallet, and making the pallet carrier and control means operate so that the plurality of pallets or a given number of pallets as a subgroup are vertically moved up to a predetermined position where the movement of the pallets is stopped once and where at least one pallet is moved up to a predetermined position.

BRIEF DESCRIPTION OF THE DRAWINGS

Referring now to the accompanying drawings, a description will be given of an embodiment of the present invention applied to an apparatus for manufacturing original negatives. In the drawings, like reference characters designates like or corresponding parts and the description of them will be omitted.

FIG. 5 is a perspective view of the principal part of the subgroup pallet carrier mechanism shown in FIGS. 2 and 4.

DETAILED DESCRIPTION OF THE PREFERRED EMBODIMENTS

Figure 1:
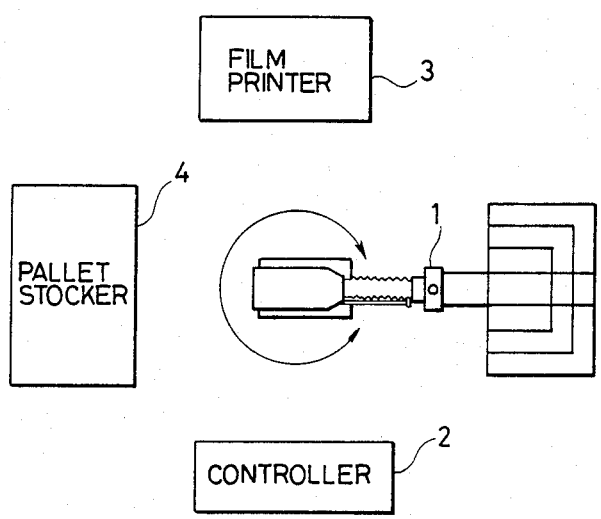
FIG. 1 illustrates a total system configuration embodying the present invention.

As shown in FIG. 1, the total system comprises a robot 1 for use in manufacturing original negatives, a controlling device 2 such as a computer, a printing pattern film printing device 3, and a pallet stocker apparatus 4. This configuration has been disclosed in commonly assigned U.S. patent application Ser. No. 728,619, filed April 29, 1985.

Figure 2:
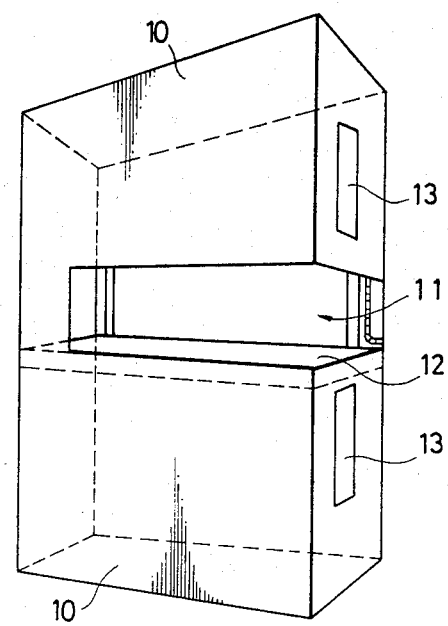
FIG. 2 is an external view of a printing pallet stocker apparatus embodying the present invention.

As shown in FIG. 2, the pallet stocker apparatus according to the present invention comprises a cover 10 of the apparatus having an entrance and exit 11 where an arm of the robot 1 takes printing pattern films in and out of the stocker and observation windows 13 into the stocker.

Figure 3:
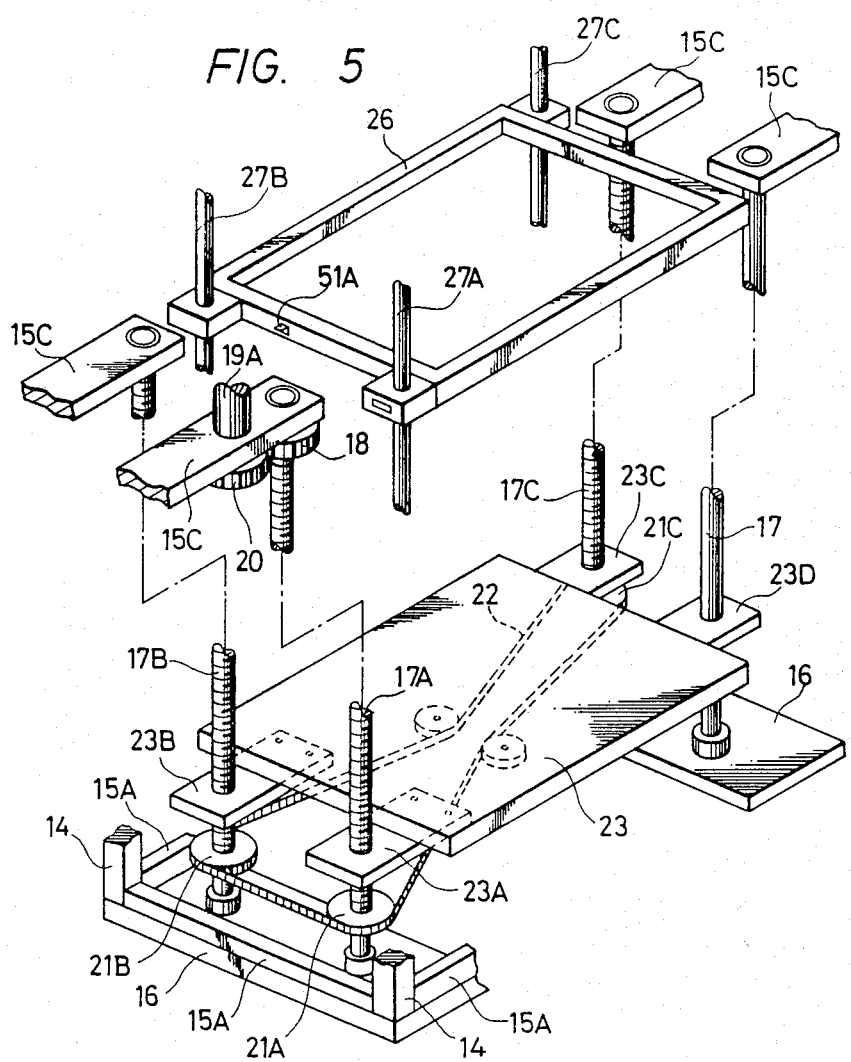
FIG. 3 is a cross section of a stack of pallets.

Contained within the stocker are a stack of about ten vertically movable pallet support frame 26, as shown in FIG. 3. On each pallet support frame 26 is placed a pallet 22, in the form of a plate, having several pins 22A which position several sheets of printing pattern film 22B. Generally, each different pallet 22 contains multiple copies of different printing pattern films 22B. The purpose of the invention is to position the correct pallet at the bottom of the entrance and exit 11 so that the robot arm can grasp the desired type of printing pattern film 22B.

Figure 4:
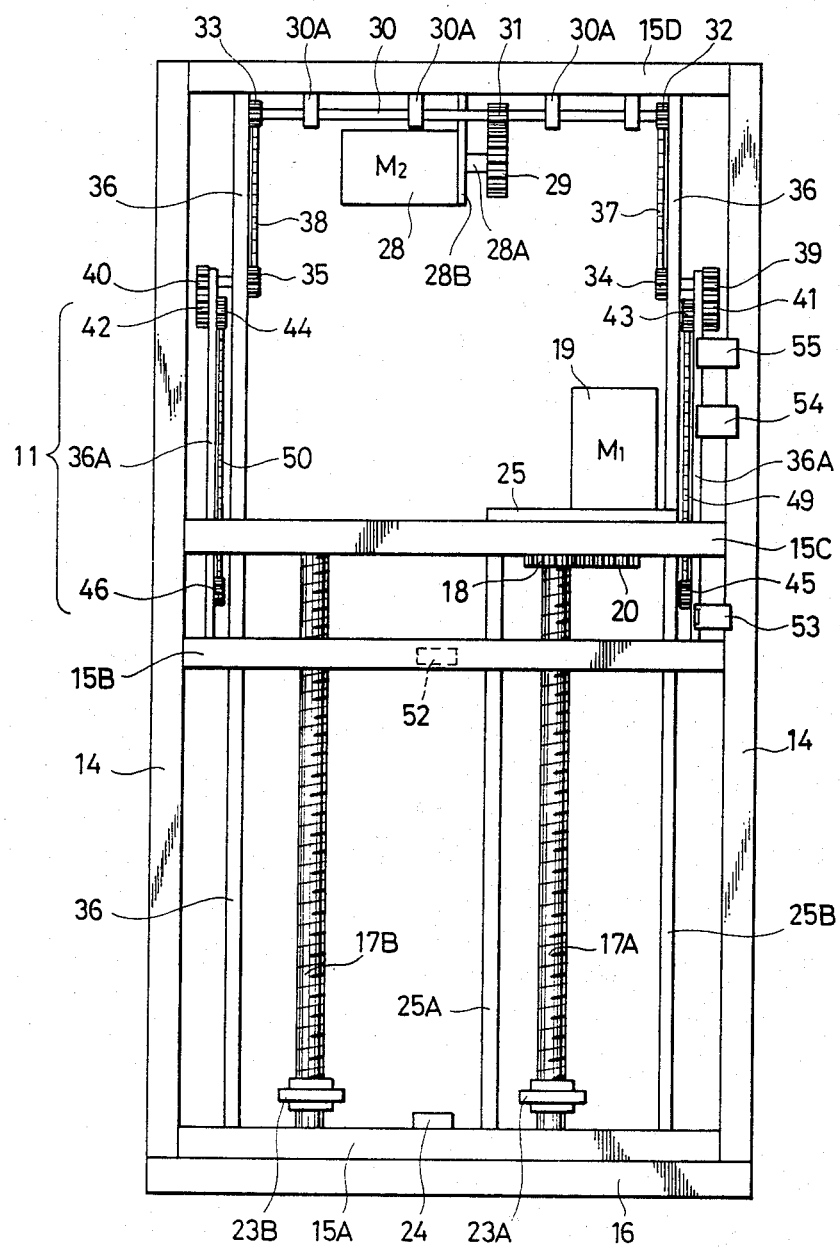
FIG. 4 is a rear elevation of the schematic construction of the printing pallet stocker apparatus shown in FIG. 1.

As shown in FIGS. 4 and 5, there are four vertical support frames 14, four horizontal support frame 15A, 15B, 15C and 15D, and a support stand 16 to which the vertical support frame 14 and the horizontal support frame 15A are fitted. The case of the printing pallet stocker apparatus is formed by combining the vertical support frame 14 and the horizontal support frames 15A - 15D into a rectangular body.

As shown in FIG. 5, three screw rods 17A, 17B and 17C are rotatably fitted into the support stand 16 and one solid rod 17 is also provided. The front ends of the screw rods 17A, 17B and 17C are rotatably fitted to the horizontal support frame 15C, whereas the front end of the solid rod 17 is fixed to the horizontal support frame 15C. A gear 18 is attached to the upper end of the screw of the screw rod 17A, the gear 18 engaging with a gear 20 fastened to the rotary shaft 19A of a first motor 19 (FIG. 4). To the lower portions of the screw rods 17A through 17C are fastened gears 21A through 21C and an endless chain (or endless belt) 22 wound on the gear 21A through 21C is used to transmit the torque of the screw rod 17A to the other screw rods 17B and 17C.

Moreover, a support plate 23 for vertically moving all the pallets is connected to the screw rods 17A, 17B and 17C and the solid rod 17 through support members 23A through 23D.

As shown in FIG. 4, a sensor 24 in the form of a microswitch detects the lowermost position of a pallet and is installed on the horizontal support frame 15A.

The microswitch sensor 24 is used to detect the pallet in the start (initial) position.

Moreover, a motor support member 25 is fitted to the support stand 16 through support members 25A and 25B and the aforesaid first motor 19 is mounted thereon.

As shown in FIG. 5, each pallet support frame 26 is so arranged as to slidably move up and down by means of support rods 27A and 27B for guiding the pallet support frame 26 vertically. The support rods 27A and 27B are installed on the support stand 16.

As shown in FIG. 4, a second motor 28 is employed to drive a pallet division mechanism. The second motor 28 is supported by the horizontal support frame 15D through a motor support member 28B. A gear 29 is fitted to the rotary shaft 28A of the second motor 28. The gear 29 is made to engage with a gear 31 fitted to a rotary shaft 30, which is rotatably fitted thereto through a support member 30A fitted to the horizontal support frame 15D. Both ends of the rotary shaft 30 are equipped with gears 32 and 33, respectively.

Figure 6:
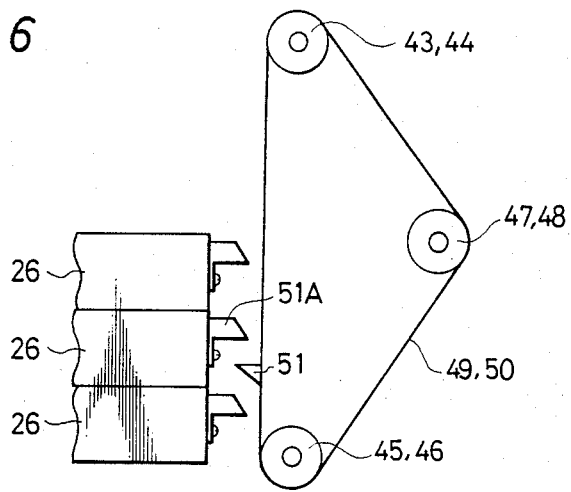
FIG. 6 is a schematic of the carrier mechanism for moving only one pallet shown in FIG. 3 and those pallets above it.
Figure 7:
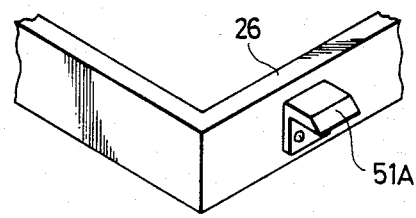
FIG. 7 is a perspective view of the structure of part of the pallet support frame engaging with the pawl fitted to the chain shown in FIG. 6.

As shown in FIG. 4, gears 34 and 35 are rotatably supported by support members 36 fitted to the horizontal support frames 15A and 15D. One of the support members 36 is simultaneously used as the support member 25B for supporting the motor support member 25. A chain 37 is wound on the aforesaid gears 32 and 34, whereas a corresponding chain 38 is wound on the gears 33 and 35 to transmit the torque derived from the rotary shaft 30 to the gears 34 and 35. A gear 39 is fitted to the rotary shaft of the gear 34, whereas a corresponding gear 40 is fitted to the rotary shaft of the gear 35. A gear 41 engages with the gear 39, whereas a gear 42 engages with the gear 42. A gear 43 is fitted to the rotary shaft of the gear 41, whereas a corresponding gear 44 is fitted to the rotary shaft of the gear 42. The gears 41 through 44 are rotatably fitted to the support member 36A. Moreover, gears 45 and 46 and tension gears 47 and 48 (shown in FIG. 6 though not shown in FIG. 4) are also rotatably fitted to the support member 36A. A pallet separating chain 49 is wound in between the gears 43 and 45 and the tension gear 47, whereas a corresponding pallet separating chain 50 is streched over between the gears 44 and 46 and the tension gears 48. As shown in FIG. 6, pallet hooking pawls 51 are fitted to the pallet separating chains 49 and 50. The pallet hooking pawls 51 allows a pawl 51A fitted to the pallet support frame 26 shown in FIGS. 6 and 7 to vertically move the pallet frame 26 up and down along with all pallet frames 26 stacked thereabout.

Because of the inclined back faces of the pallet hooking pawl 51 and the pawls 51a on the pallet support frames 26, they slide over each other when the chains 49 and 50 are rotated counter-clockwise. However, it is advantageous to slide the gears 43, 44, 45 and 46 horizontally away from the pallet support frames 26 when non-engagement of the pawls 51 and 51a is desired.

Figure 8:
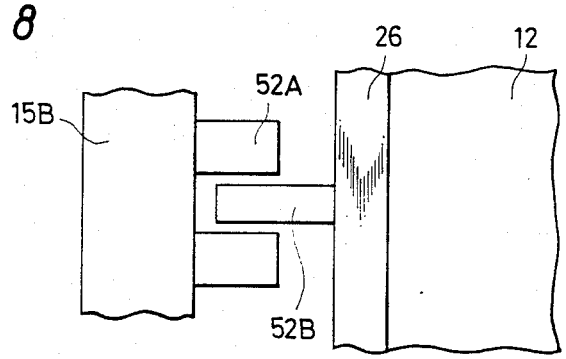
FIG. 8 is a top view of a pallet counting mechanism.

As shown in FIG. 4, the desired pallet is moved to a position on the face of the horizontal support frame 15B where the robot hands operate. The horizontal support frame 15B is also equipped with a sensor 52 for detecting the pallets set in place to detect the number of pallets passing the home position. A photosensor 52A is employed, as shown in FIG. 8, for instance, as the sensor 52 for detecting the pallets set in place. A projection 52B for detecting the number of pallets screening the light emitted from the photosensor 52A is fitted to each of the pallet support frames 26.

A sensor 53 for detecting the uppermost pallet is, as shown in FIG. 4, placed at a fixed place near the middle of the vertical support frame 14. The sensor 53 for detecting the uppermost pallet is used to detect the uppermost pallet which has been the lowermost one and a microswitch, for instance, is employed.

Figure 10:
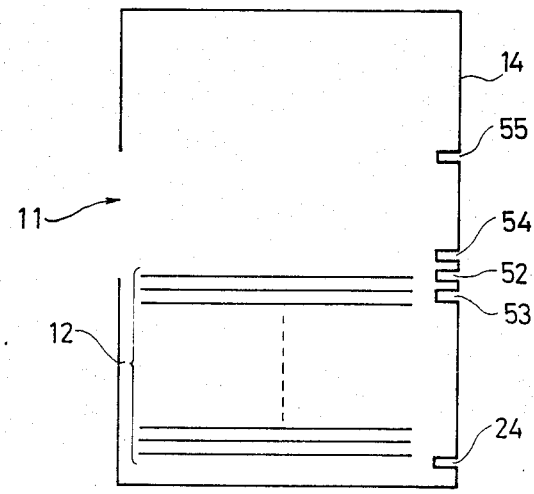
FIG. 10 is a replica of showing the relation of the pallet carrier operation of the printing pallet stocker apparatus embodying the present invention to each control sensor.

As shown in FIGS. 4 and 10, a sensor 54 for detecting the closing point and a sensor 55 for detecting the opening point are also attached to the vertical support frame 14. The sensor 54 for detecting the closing point is used to detect that the pallets are consecutive (not separated from each other), whereas the sensor 55 for detecting the opening point is employed to detect that the pallets are fully separated from each other.

Figure 9:
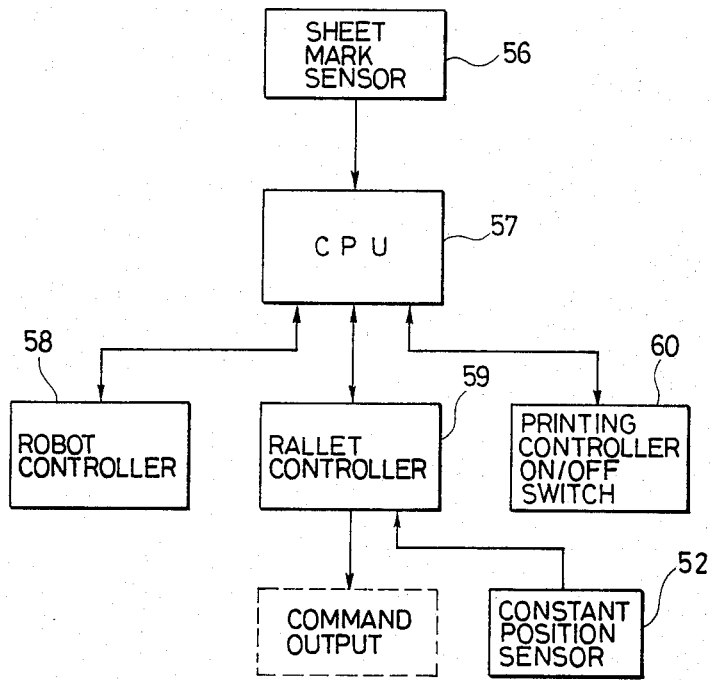
FIG. 9 is a block diagram showing the schematic construction of the control mechanism of the printing pallet stocker apparatus embodying the present invention.

As shown in FIG. 9, the system configuration of the control mechanism of the printing pallet stocker apparatus according to this embodiment is such that the system includes a sensor 56 for reading sheet marks. The sensor 56 is fitted to the hands of the robot 1 for manufacturing plates as shown in FIG. 1. A central processor 57 contained in the controlling device 2 is formed with a microcomputer. Control means 58 control the robot 1 for manufacturing plates. The control means 58 is also formed with a microcomputer. Pallet control means 59 control the pallet stocker apparatus, the pallet control means 59 being formed with a microcomputer. Control means 60 control the printing pattern film printing device 3. The previously mentioned sensor 52 detects the fixed position of the pallet, the sensor being formed with a photosensor 52A.

Now, the pallet control operation will be described.

Figure 11:
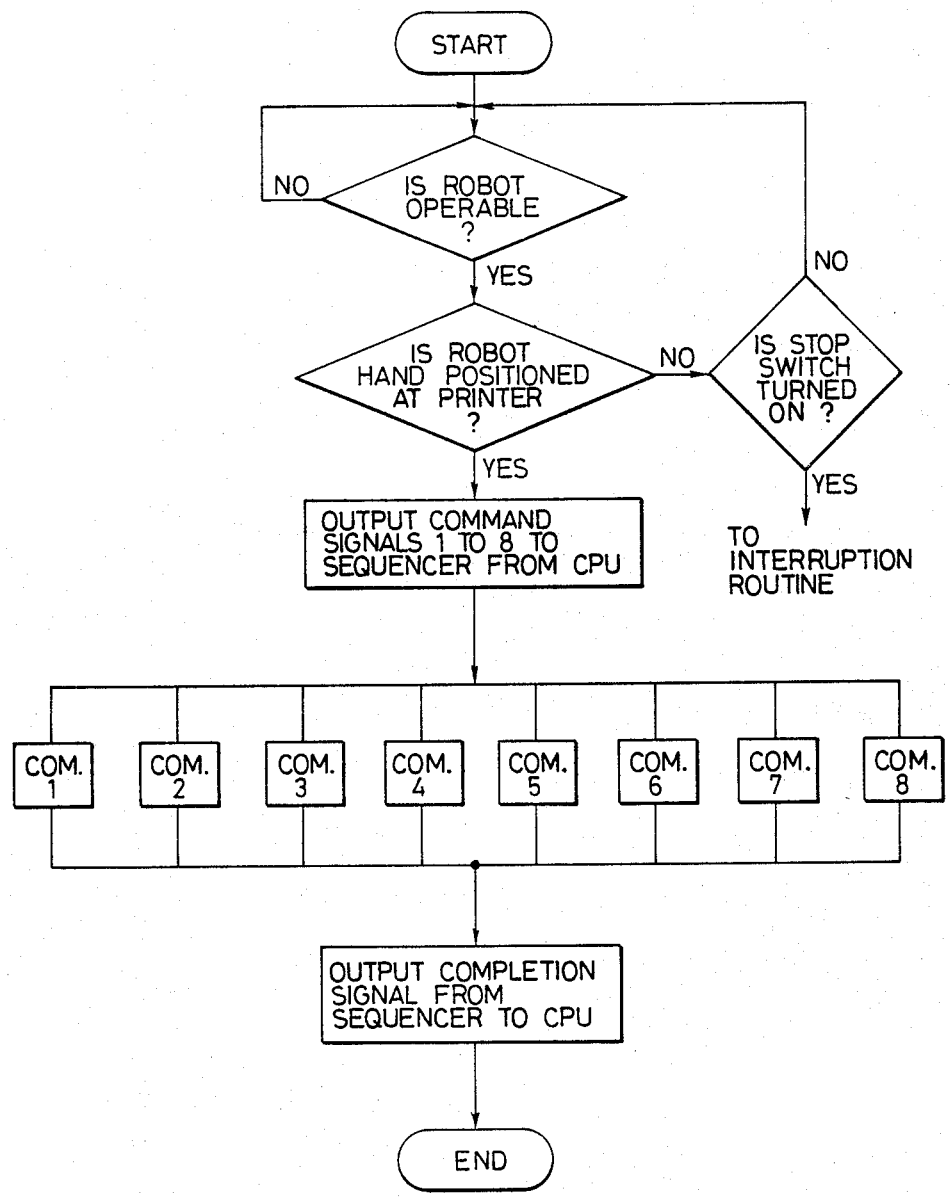
FIG. 11 is a flowchart of the control software for the printing pallet stocker apparatus embodying the present invention.

The pallet control operation is conducted according to software based on a flowchart shown in FIG. 11. p More specifically, the central processor judges whether the robot 1 for manufacturing plates can be operated when the start switch is turned on and, if the answer is YES, judgment is passed on whether the hands of the robot 1 for manufacturing plates is located at the printing pattern film printing device 3. If the result is YES, a selected sequence of commands 1 through 8 are sent by the central processor 57 to each component, so that operations as described later are conducted. If the answer, however, is NO, judgment is made On whether the stop switch is held on or off. If NO, the operation returns to the start or, if YES, an interrupting process is followed.

The contents of the aforesaid commands are as follows:

Command 1: to lift pallets;
Command 2: to lower pallets;
Command 3: to separate pallets and lift them;
Command 4: to lower pallets and recombine them;
Command 5: to lift pallets by a set number of pallets;
Command 6: to lower pallets by a set number of pallets;
Command 7: to lift pallets by one pallet; and
Command 8: to lower pallets by one pallet.

The sequences of operation resulting from these commands are now described.

(1) Operation of lifting pallets.
(a) Output of positioning completion is reset.
(b) All the pallets are raised from the predetermined lowered position at high speed by the support plate 23.
(c) The pallets are stopped at the point of time the uppermost moving pallet support frame 26 is detected by the sensor 53 for detecting the uppermost pallet (position sensor).
(d) All the pallets are raised up by the support frame 26 and counted by the sensor 52 so that the selected support frame 26 is raised to a position where the vertically moving pawl 51A engages with the pallet hooking pawl 51 of that selected support frame 26.
(e) Output of positioning completion is turned on.

This operation of raising pallets i effected not during the operation of the arm of the robot 1 for manufacturing plates but only during that of the printing pattern film printing device 3. In addition, the operation of raising them is stopped when the uppermost limit switch or irregularity switch of the vertical moving pawl 51A is activated.

(2) Operation of lowering pallets.
(a) Output of positioning completion is reset.
(b) The pallets are lowered from a previously determined position by lowering the support plate 23.
(c) The pallets are stopped when the lowermost pallet is detected by the sensor 24 for detecting the pallet support frame 26 of the lowermost pallet.
(d) Output of positioning completion is turned on.

This operation of lowering pallets is effected not during the operation of the arm of the robot 1 for manufacturing plates but only during that of the printing pattern film printing device 3.

(3) Operation of separating and lifting pallets.
(a) Output of positioning completion is reset.
(b) The upper pallets are lifted by the pallet hooking pawls 51 from the predetermined position near the horizontal support frame 15B. Then the lowermost pallet of these rising upper pallets is detected by the sensor 55 for detecting the opening point, so that the operation of separating and lifting the pallets is stopped.
(c) Output of positioning completion is turned on.

This operation of separating and lifting pallets is effected not during the operation of the arm of the robot 1 for manufacturing plates but only that of the printing pattern film printing device 3.

(4) Operation of lowering and recombining pallets.
(a) Output of positioning completion is reset.
(b) After the pallets are separated and lifted, the upper pallets located in the upper pallet fixing position (opening point) are lowered down to their original positions by the engaged pallet hooking pawls 51 and the operation. Lowering the pallets is stopped when the sensor 54 for detecting the closing point detects the pallets thus lowered.
(c) Output of positioning completion is reset.

The operation of separating and lowering pallets is effected not during the operation of the arm of the robot 1 for manufacturing plates but only during that of the printing pattern film printing device 3.

In accessing a single pallet, the operations (1), (3), (4) and (2) are carried out in that order with the robot arm accessing the film between operations (3) and (4).

(5) Operation of lifting pallets by a set number of pallets.
(a) Output of positioning completion is reset.
(b) The pallets are lifted by the support plate 23 to an extent of the number of fixed pulses (e.g., 4 pulses) corresponding to the size of the set number of pallets.
(c) Output of positioning completion is turned on.

This operation of lifting by a set number of pallets is effected not during the operation of the arm of the robot 1 for manufacturing plates but only during that of the printing pattern film printing device 3.

(6) Operation of lowering pallets by a set number of pallets.

(a) Output of positioning completion is reset.

(b) Pallets are lowered to an extent of the number of fixed pulses (e.g., 4 pulses) corresponding to the size of the set number of pallets.

(c) Output of positioning completion is turned on.

This operation of lowering a set of pallets is effected not during the operation of the arm of the robot 1 for manufacturing plates but only during that of the printing pattern film printing device 3.

(7) Operation of lifting by one pallet.

(a) Output of positioning completion is reset.

(b) The pallets are lifted by the support frame 23 to the extent of the number of fixed pulses corresponding to one pallet.

(c) Output of positioning completion is turned on.

This operation of lowering one pallet is effected not during the operation of the arm of the robot 1 for manufacturing plates but only during that of the printing pattern film printing device 3.

(8) Operation of lowering by one pallet.

(a) Output of positioning completion is reset (b) The pallets are lowered by the support frame 23 to an extent of the number of fixed pulses corresponding to one pallet.

(c) Output of positioning completion is turned on.

This operation of lowering one pallet is effected not during the operation of the arm of the robot 1 for manufacturing plates but only during that of the printing pattern film printing device 3.

The operations (6), (7), (8) and (9) where all the pallets are raised and lowered are used when printing transfer films 22B on neighboring pallets are to be accessed by the robot arm without the necessity of completely lowering the pallets into the stocker. These operations would be preceded by an operation (4) in which the pawl 51 lowers the upper pallets to rest upon the lower pallets and disengages therefrom. After all the pallets are raised or lowered by the support plate 23 in one of the operations (6) through (9), the pawl 51 again engages one of the pallet hooking pawls 51A to raise the upper pallets.

A description has been given in specific terms in accordance with the embodiment of the present invention but the invention is not limited to the aforesaid embodiment and it is believed obvious that modification and variation of the invention is possible without departing from the spirit and the scope thereof.

The pallet stocker apparatus for a printer according to the present invention comprises a pallet support mechanism for supporting a plurality of pallets piled up with a shape like shelves, the pallet being used to store printing pattern films in such a manner that the films can be taken in and out, a pallet carrier mechanism for vertically moving each of said pallets, and pallet carrier control means for making the pallet carrier mechanism operate so that the plurality of pallets or a given number of pallets as a subgroup are vertically moved up to a predetermined position where the movement of said pallets is stopped once and where at least one pallet is moved up to a predetermined position. In consequence, the space for containing and operating the pallets can be reduced and the operability of the printing pallet stocker apparatus can also be improved.

What is claimed is:

1. A pallet stocker system, comprising:
   a pallet stocker for storing a plurality of pallets piled in a stack, said pallets being used to store sheets and having first pawl members; and
   means for transferring said sheets from selected ones of said pallets in said pallet stocker and to selected ones of said pallets in said pallet stocker, said transferring of said sheets to and from said pallet being performed with a vertical motion of said transferred sheets separating from or coming into contact with said pallets;
   said pallet stocker comprising
   a pallet support mechanism for supporting in said stack said plurality of pallets, and
   a pallet carrier mechanism for vertically moving a selected one of any of said plurality of pallets, thereby moving all of said pallets above said selected pallet in said stack, said pallet carrier mechanism including a chain having a second pawl member selectively engagable with one of said first pawl members and further comprising driving means for driving said chain in opposite vertical directions.

2. A pallet stocker system as recited in claim 1, wherein said pallet support mechanism supports said stack of said plurality of pallets to a controllable height.

3. A pallet stocker system as recited in claim 1, further comprising pallet carrier control means for causing said pallet carrier mechanism to simultaneously raise a selected subgroup of said plurality of pallets to a raised position wherein at least one pallet of said selected subgroup is raised to a predetermined position.

4. A pallet stocker system as recited in claim 3, wherein said pallet support mechanism supports said stack of said plurality of pallets to a controllable height.

5. A pallet stocker system as recited in claim 4, wherein said pallet support mechanism includes a vertical column on which said pallets are vertically movable and horizontally fixed.

6. A pallet stocker system as recited in claim 1, wherein said pallet carrier mechanism vertically moves said selected pallet upward by a first distance thereby moving all said pallets above said selected pallet upward by said first distance and opening a gap of said first distance between said selected pallet and an uppermost one of said pallets below said selected pallet.

7. A pallet stocker system as recited in claim 6, wherein said transferring means operates within at least a portion of said gap.

8. A pallet stocker system, comprising:
   a pallet stocker for storing a plurality of pallets piled in a stack, said pallets having first pawl members and being used to store sheets; and
   means for transferring said sheets from selected ones of said pallets in said pallet stocker and to selected ones of said pallets in said pallet stocker, said transferring of said sheets to and from said pallet being performed with a vertical motion of said transferred sheets separating from or coming into a contact with said pallets;
   said pallet stocker comprising
   a pallet support mechanism for supporting in said stack said plurality of pallets, wherein said pallet support mechanism supports said stack of said plurality of pallets to a controllable height which includes a vertical column on which said pallets are vertically moveable and horizontally fixed and
   a pallet carrier mechanism for vertically moving a selected one of said plurality of pallets, thereby moving all of said pallets above said selected pallet in said stack, said pallet carrier mechanism including a chain having a second pawl member selectively engagable with one of said first pawl members and further comprising driving means for driving said chain in opposite vertical directions;
said pallet stocker system further comprising pallet carrier control means for causing said pallet carrier mechanism to simultaneously raise a selected subgroup of said plurality of pallets to a selected position wherein at least one pallet of said selected subgroup is raised to a predetermined position.

* * * * *